United States Patent

Klose et al.

[11] Patent Number: 5,930,596
[45] Date of Patent: Jul. 27, 1999

[54] SEMICONDUCTOR COMPONENT FOR VERTICAL INTEGRATION AND MANUFACTURING METHOD

[75] Inventors: Helmut Klose; Werner Weber; Emmerich Bertagnolli, all of München; Siegmar Köppe, Laatzen; Holger Hübner, Baldham, all of Germany

[73] Assignee: Siemens Aktiengesellschaft, Munich, Germany

[21] Appl. No.: 08/721,980

[22] PCT Filed: Mar. 7, 1995

[86] PCT No.: PCT/DE95/00313

§ 371 Date: Sep. 27, 1996

§ 102(e) Date: Sep. 27, 1996

[87] PCT Pub. No.: WO96/26568

PCT Pub. Date: Oct. 5, 1995

[30] Foreign Application Priority Data

Mar. 29, 1994 [DE] Germany .............................. 44 10 947

[51] Int. Cl.[6] .......................... H01L 21/00; H01L 21/4763
[52] U.S. Cl. ............................. 438/98; 438/622; 438/611; 438/619; 438/117
[58] Field of Search ............................. 438/98, 622, 611, 438/619, 117

[56] References Cited

U.S. PATENT DOCUMENTS 3,760,238   9/1973   Hamer et al. .
5,521,104   5/1996   Walker ................................. 250/338.1
5,612,257   3/1997   Tserng et al. ............................ 438/108
5,763,321   6/1998   Ohshima et al. ........................ 438/618

FOREIGN PATENT DOCUMENTS 0 078 337 A3   5/1983   European Pat. Off. .
0 238 089 A3   9/1987   European Pat. Off. .
0 295 914 A3  12/1988   European Pat. Off. .
   2188309     1/1974   France .
32 33 195 A1   3/1983   Germany .

*Primary Examiner*—John F. Niebling
*Assistant Examiner*—John Murphy
*Attorney, Agent, or Firm*—Hill & Simpson

[57] ABSTRACT

A terminal metallization (8) is applied onto and structured on a layer structure on the upper side of the component, the terminal metallization is applied on the upper side of an insulating layer (7) with an opening on a metallization (6) provided for electrical connection. By filling a hole produced in a covering dielectric with metal, a contact rod (12) seated on this terminal metallization (8) is formed. This contact rod is resiliently movable in a surrounding opening (14) of the component on the free part of the terminal metallization (8) anchored in the layer structure. This enables the reversible contacting of the component to a further component arranged vertically thereto, whereby the planar upper sides lying opposite one another can be brought into intimate contact because the contact rod (12) pressed against a contact (15) of the other component is pressed back into the opening (14) and an adequately firm connection of the contacts is achieved by the spring power of the terminal metallization (8).

3 Claims, 3 Drawing Sheets

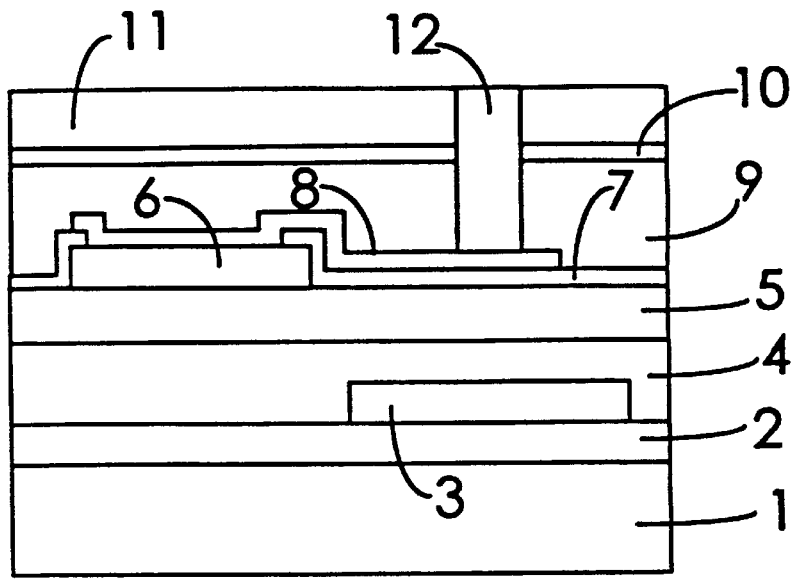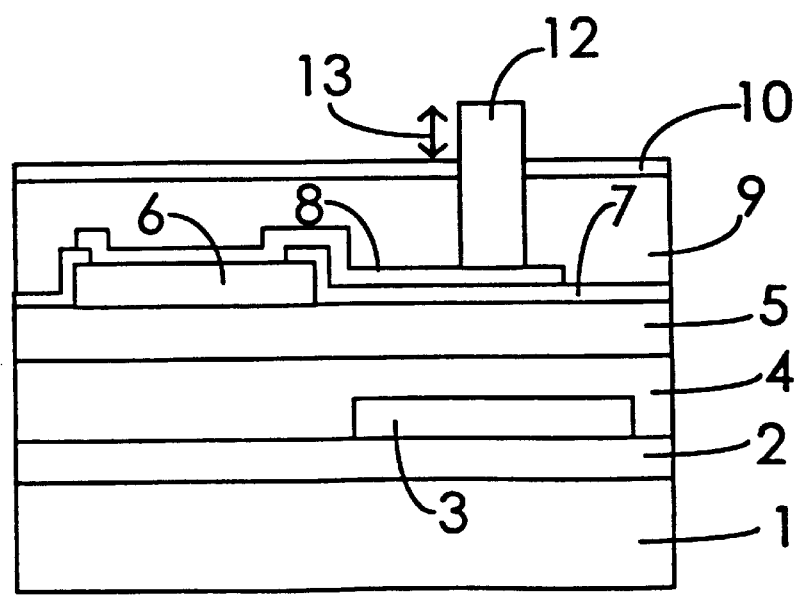

SEMICONDUCTOR COMPONENT FOR VERTICAL INTEGRATION AND MANUFACTURING METHOD

BACKGROUND OF THE INVENTION

The present invention is directed to a semi-conductor component for vertical integration with terminal contacts specifically fashioned for reversible contacting, and is also directed to an appertaining manufacturing method.

The vertical integration of semiconductor components, i.e. the arrangement of different function levels above one another, allows a parallel communication of these components with low outlay, electrically conductive connection in one level, and speed-limiting interchip connections are also avoided. Despite enhanced functionality, moreover, such a vertically integrated semiconductor chip can be accommodated in the same housing. A possibility of reversible contacting for these circuit levels with extremely miniaturized terminals must be available both for the manufacture of these components as well as for the required test of individual circuit levels integrated therein.

French reference FR-A-2 188 309 (corresponding to U.S. Pat. No. 3,825,353) discloses a semiconductor component on whose upper side a contact is secured to a flexible metal arm. This contact serves for mounting the component on a motherboard, whereby the contact is pressed against a contact surface of the motherboard, and the mechanical tension in the metal arm assures an adequately firm contacting of the contacts. European reference EP 0 238 089 A3 (corresponding to U.S. Pat. No. 4,939,568) discloses a three-dimensionally integrated circuit and an appertaining manufacturing method. A plurality of semiconductor levels with terminal contacts at the upper sides are arranged in a vertical stack and durably joined to one another by a thermoplastic resin.

SUMMARY OF THE INVENTION

An object of the present invention is to specify a semiconductor component that is suitable for reversible vertical integration, particularly for the purpose of testing further circuit levels. The method for manufacturing should a component should also be recited.

In general terms the present invention is a method for the manufacture of a semiconductor component, the method having the following steps: in a first step, a layer structure defined by an intended functioning of the semiconductor component is applied onto a substrate; in a second step, an insulating layer is applied that leaves a region provided for electrical connection free; in a third step, a terminal metallization is applied and structured; in a fourth step, dielectric is applied surface-wide; in a fifth step, a hole is produced in this dielectric, so that the terminal metallization is uncovered; in a sixth step, this hole is filled with a metal for forming a contact rod; in a seventh step, so much of the dielectric is removed that the contact rod projects beyond the upper side as intended, and in an eighth step, the contact rod and a portion of the terminal metallization adjacent thereto are uncovered by etching a surrounding opening.

Advantageous developments of the present invention are as follows.

The fourth step is implemented in that a first dielectric layer, an etch stop layer and a second dielectric layer are applied surface-wide. The fifth step is implemented in that a hole is etched into these dielectric layers and into this etch stop layer, so that the terminal metallization is uncovered. The seventh step is implemented in that the second dielectric layer is removed down to the etch stop layer.

In the above-described method, a semiconductor component is used for testing a further semiconductor component. The semiconductor components are provided with functional structures adapted to this test. The semiconductor components are brought into contact with one another such that the contact rod of the one semiconductor component is pressed against a contact of the other semiconductor component firmly enough for an electrically conductive connection.

Terminal contacts for vertical contacting are applied on an upper side in the inventive semiconductor component. These contacts are seated on a structured metal layer that is anchored in a layer structure of the component and projects into an opening in the semiconductor material in the fashion of a leaf spring. A respective contact is seated on the end of this, for example, strip-shaped metal layer projecting into this opening, this respective contact projecting beyond the appertaining surface of the component to such an extent that, given vertical joining to a further component, these contacts are pressed against terminal surfaces of the further component when those surface of the two components facing toward one another are brought into contact with one another. Due to the metal layers in the fashion of a leaf spring, the respective metal contact is attached with such mobility that the otherwise planar upper sides of the components can be pressed against one another, whereby the contact is pressed back into the opening and simultaneously exerts a firm pressure on the contact surface lying thereopposite that is adequate for electrical connections. What is thus achieved is that the individual component levels that are to be arranged vertically above one another respectively comprise planar surfaces toward one another, and the contacts of the one component are simultaneously pressed against the terminal surfaces of the other component by a type of resilient contact pressure. Since the electrically conductive connection between different circuit levels is produced in this way without the terminal contacts having to be durably connected to one another, a reversible, vertical electrical connection of various circuit levels is possible. This is especially advantageous when the inventive semiconductor component is to be connected to a further component level for testing purposes. It is likewise advantageous when, during the manufacture of a vertically integrated chip, the respectively finished sub-stacks are to be tested for functionability and, given malfunctions, the circuit level added last is to be removed and replaced by another. Given faultless function of the vertically connected circuit levels, the level added last and that is realized according to the present invention can be durably joined to the remaining sub-stack, for example in that it is heated and a previously applied adhesive layer is thereby activated.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIGS. 1 through 4 show intermediate products for the inventive semiconductor component in cross-section after various steps of the manufacturing method;

DESCRIPTION OF THE PREFERRED EMBODIMENTS

Figure 1:
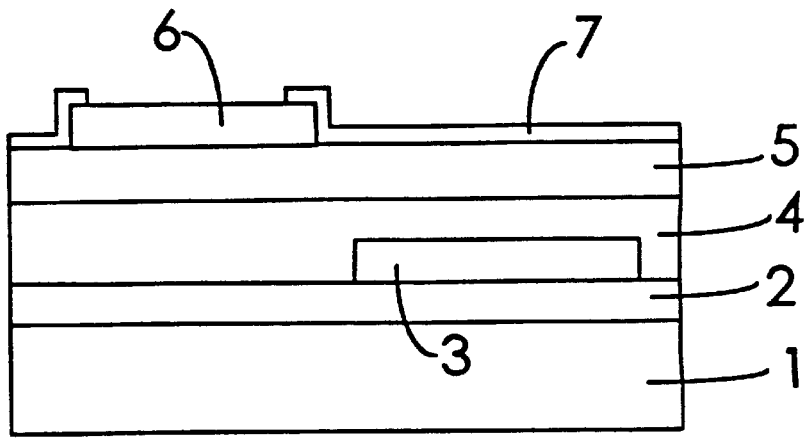

FIG. 1 shows how a layer structure for the intended functioning of the finished component is applied on a substrate 1. As an example, a lower dielectric layer 2, for example an insulating oxide, is applied as insulation on the substrate. This layer can be omitted given employment of a semi-insulating substrate. The laterally limited layer 3 is intended to illustrate a function element integrated in the component. For example, this layer 3 can be a polysilicon layer for the gate of a transistor given an IC on silicon. This conductive structure is embedded into further dielectric layers 4, 5, whereby the first dielectric layer 4 effects a planarization of the surface. Appropriate via holes for the electrical connection of the structure of the functions elements to metallizations 6 applied on the upper side of the upper dielectric layer 5 are located in these dielectric layers 4, 5. These metallizations 6, for example terminal contacts or interconnects, are covered with an insulating layer in which openings for uncovering the metallizations 6 are produced.

Figure 2:
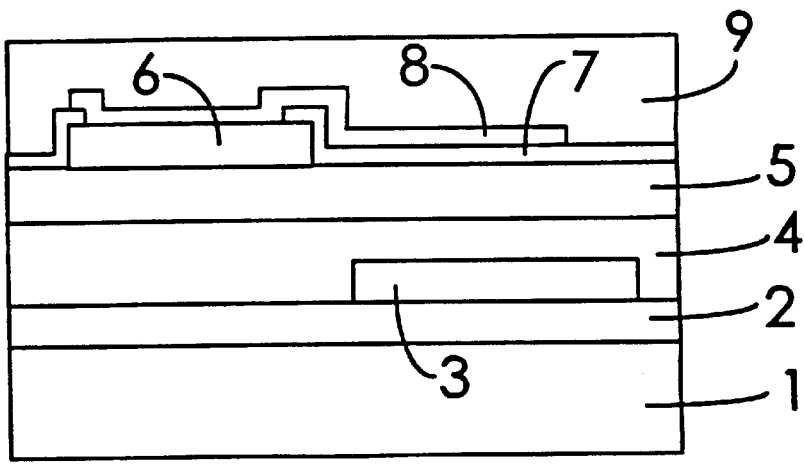

According to FIG. 2, insulating layer 7 is formed on layer 5 and side of metallization 6. A metal layer can be applied and structured such that the remaining portion of this layer, as terminal metallization 8, is connected to the free terminal surface of the metallization 6. The upper side is then embedded again into a dielectric layer 9.

In a following step, the dielectric is removed to such an extent that the contact rod 12 projects beyond the upper side to a height 13 as shown in FIG. 4. This height 13 typically amounts, for example, to 2 μm. The etch stop layer 10 is advantageous in this step that leads to the structure of FIG. 4. The second dielectric layer 11, namely, can be wet-chemically removed completely down to the etch stop layer 10. It is then achieved on the basis of a suitable selection of the layer thicknesses that the contact rod 12 projects beyond the upper side of the etch stop layer 10 to the intended height 13. When necessary, terminal surfaces can then be etched free on the upper side of the metallizations or interconnects.

Figure 5:
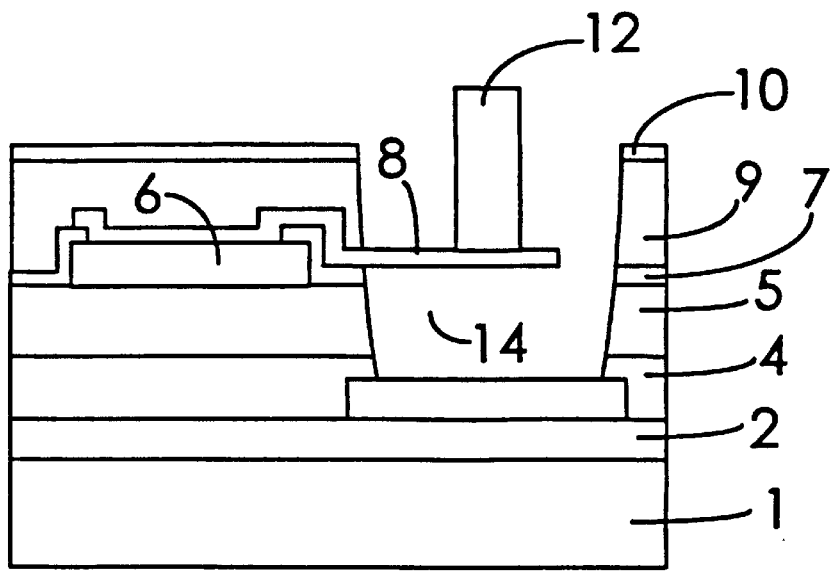
FIG. 5 shows a typical exemplary embodiment of the inventive component in cross-section.

The contact rod 12 and the portion of the terminal metallization 8 on which this contact rod 12 is seated are then etched free all around (surrounding opening 14), so that the finished component as shown in cross-section in FIG. 5 arises. In this way, the metallization 6 is provided with a terminal contact via the terminal metallization 8 and the contact rod 12 that projects beyond the upper side but yields resiliently under contacting pressure.

Figure 6:
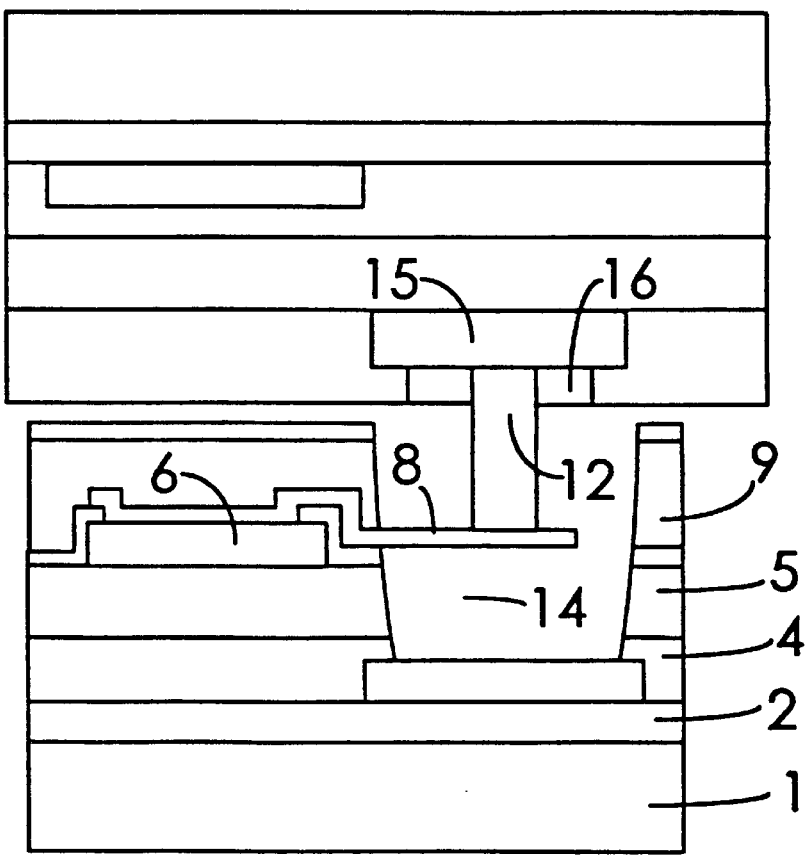
FIG. 6 shows the vertical joining of an inventive component with a further component by way of example.

Given the connection of this component with a further component as shown in FIG. 6, the surfaces facing toward one another are brought into contact with one another, whereby the contact rod 12 of the inventive component is pressed onto the free surface of a contact in a contact opening 16 of the other component. Since the contact rod 12 is pressed back into the surrounding opening 14 when the components are pressed together, the upper sides of the components can be brought into intimate contact, whereby a reliable electrical contact is established even given possible irregularities of the upper sides.

In the arrangement of FIG. 6, the inventive component can, for example, be attached to a holder, so that the contact rods 12 are directed down. The component can then be utilized for testing the base IC (the upper component in FIG. 6). The layout of the circuits must then be designed for this test. The ICs to be tested can be successively reversibly contacts with the inventive component in this way.

A further employment of the inventive component derives given the vertical integration of circuit levels. The various circuit levels are provided with contact rods corresponding to the inventive component. As in the testing, the electrical contacting initially ensues reversibly in the vertical connection. When it is found that the appertaining sub-stack does not meet its function, the circuit level added last can be removed and replaced by another. When a test, for example employing an inventive component, shows that the sub-stack meets its function, the circuit level added last can be durably connected to the rest of the sub-stack, for example in that an adhesive layer previously applied to the joining surface is activated, for example by heating. This adhesive layer or glue layer is applied onto the surface of the sub-stack already assembled before the circuit level is joined to the sub-stack. After the application of this adhesive layer, openings are produced in order to uncover the contact surfaces for the electrical connection to the following circuit level. The adhesive layer is thereby also removed in this regions.

The inventive component can fundamentally comprise an arbitrary plurality of resiliently seated contact rods. Two semiconductor components to be connected can respectively comprise both such contact rods as well as terminal surfaces at the surfaces to be joined to one another. When the substrate employed for the manufacture is removed, the upper side of the component lying thereopposite can also be provided with resilient contact rods.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A method for manufacturing a semiconductor component, comprising the steps of:

in a first step, applying a layer structure defined by an intended functioning of the semiconductor component onto a substrate;

in a second step, applying on the layer structure an insulating layer that leaves a region provided for electrical connection free;

in a third step, applying and structuring a terminal metallization on the insulating layer;

in a fourth step, applying a dielectric surface-wide, over the insulating layer and the metallization;

in a fifth step, producing a hole in said dielectric, so that the terminal metallization is uncovered;

in a sixth step, filling said hole with a metal for forming a contact rod in a seventh step, removing the dielectric such that the contact rod projects beyond an upper side of the semiconductor component; and in an eighth step, etching an area that surrounds the contact rod such that the contact rod and a portion of the terminal metallization adjacent thereto are uncovered.

2. The method according to claim 1, wherein the fourth step is implemented in that a first dielectric layer, an etch stop layer and a second dielectric layer are applied surface-wide;

wherein the fifth step is implemented in that a hole is etched into the first and second dielectric layers and into the etch stop layer, so that the terminal metallization is uncovered; and wherein the seventh step is implemented in that the second dielectric layer is removed down to the etch stop layer.

3. The method according to claim 1, wherein the method further comprises:

providing a further semiconductor component;

using the semiconductor component for testing the further semiconductor component;

providing the semiconductor components with functional structures adapted to said testing; and bringing the semiconductor components into contact with one another such that the contact rod of the one semiconductor component is pressed against a contact of the further semiconductor component such that an electrically conductive connection is formed.

\* \* \* \* \*